APPARATUS FOR HANDLING FUSIBLE MATERIALS

Filed April 1, 1959 3 Sheets-Sheet 1

INVENTORS.
AUGUST B. GRILLON,
BLAINE J. HOLLAND,
STANLEY V. POPE,
CHARLES J. STEIGELEDER,
BY
Donald L. Ryan
AGENT.

APPARATUS FOR HANDLING FUSIBLE MATERIALS

Filed April 1, 1959 3 Sheets-Sheet 2

INVENTORS.
AUGUST B. GRILLON,
BLAINE J. HOLLAND,
STANLEY V. POPE,
CHARLES J. STEIGLEDER
BY Donald L. Royer
AGENT July 24, 1962 A. B. GRILLON ET AL 3,045,619

APPARATUS FOR HANDLING FUSIBLE MATERIALS

Filed April 1, 1959 3 Sheets-Sheet 3

INVENTORS.
AUGUST B. GRILLON,
BLAINE J. HOLLAND,
STANLEY V. POPE,
CHARLES J. STEIGELEDER,

BY Donald L. Royer
AGENT

United States Patent Office 3,045,619

Patented July 24, 1962

3,045,619

APPARATUS FOR HANDLING FUSIBLE MATERIALS

August B. Grillon, Mirada Hills, Blaine J. Holland, Inglewood, Stanley V. Pope, Malibu, and Charles J. Steigleder, San Pedro, Calif., assignors to Hughes Aircraft Company, Culver City, Calif., a corporation of Delaware Filed Apr. 1, 1959, Ser. No. 803,538
2 Claims. (Cl. 113—93)

The present invention relates generally to a soldering apparatus and relates more particularly to a machine for automatically applying molten solder to electrical component leads and associated circuit structure of printed circuit boards.

Although the descriptive disclosure hereinafter in the interest of convenience and in the particularity of its teachings is concerned with a specific embodiment of this invention adapted for automatic soldering applications, this is only illustrative. Other materials, both metals and non metals which may be fused inductively or otherwise may be substituted for solder.

In the assembly of printed circuit boards, such boards are provided with a plurality of conducting paths that are joined or terminated by means of metallic eyelets or similar structures that are disposed through openings in the boards. These eyelets serve to provide attachment points for electrical components such as resistors, capacitors, vacuum tubes, diodes and the like. Additionally, these eyelets serve electrically to interconnect circuit patterns on opposite sides of the boards and enable disposition of components on one side of a board and connection of the leads thereof to circuits on the other side of the boards.

In attaching axially leaded electrical components to circuit boards, it has been common practice to select a proper component, bend the leads at appropriate lengths at 90° to the axis of the component, insert the ends of the leads in selected pairs of eyelets in the board and thereafter manually to solder the component in position. Excessive lead lengths may thereafter be trimmed. Obviously, manual assembly of these structures is not only time consuming but there also exists the possibility that improper components may be selected and installed in incorrect pairs of eyelets or openings in the circuit board. Manual soldering also induces the possibility that the solder joint may be poor and application of excessive heat to the leads of certain types of components in the soldering operation often causes damage to the component.

The device of the present invention is intended for use as a portion of a completely automatic assembly apparatus for installing electrical components on circuit boards. The boards employed herewith are designed with uniformly spaced rows of eyelets appropriately interconnected by printed or etched circuit patterns. Components are installed on the boards in a manner to lie in adjacent side-by-side relationship. The over-all assembly machine includes means for delivering a particular preselected component from a magazine to an automatic insertion head. The insertion head grasps the leads of each component, bends the leads at appropriate positions, trims the ends of the leads and disposes such leads through pairs of proper openings or eyelets in the circuit board. The circuit board is supported on a laterally, intermittently movable platform that is appropriately indexed, whereby to dispose the desired openings or eyelets in position for reception of the component leads. Thereafter, the soldering apparatus of this invention is disposed in position whereby to dispense a controlled amount of molten solder to and about the leads of the component and within the space defined between the component leads and the associated eyelets. The amount, temperature and dispensing time for the molten solder is accurately controlled, whereby to provide the desired solder joint.

It is therefore one object of this invention to provide an automatic molten solder dispensing apparatus.

It is another important object of the invention to provide a soldering apparatus for delivering molten solder to a desired location.

It is still another object of the invention to provide a soldering apparatus having means for feeding solder material, thereafter melting such material and dispensing molten solder from suitable nozzle structures.

A further object of the invention is to provide a soldering apparatus having means for compensating for manufacturing tolerances of circuit boards and eyelet structures, whereby to permit the dispensing of molten solder to areas intermediate component leads and such eyelet structures.

Other and further important objects of the invention will become apparent from the disclosures of the following detailed specification, appended claims and accompanying drawings, wherein:

Figures 1, 3:
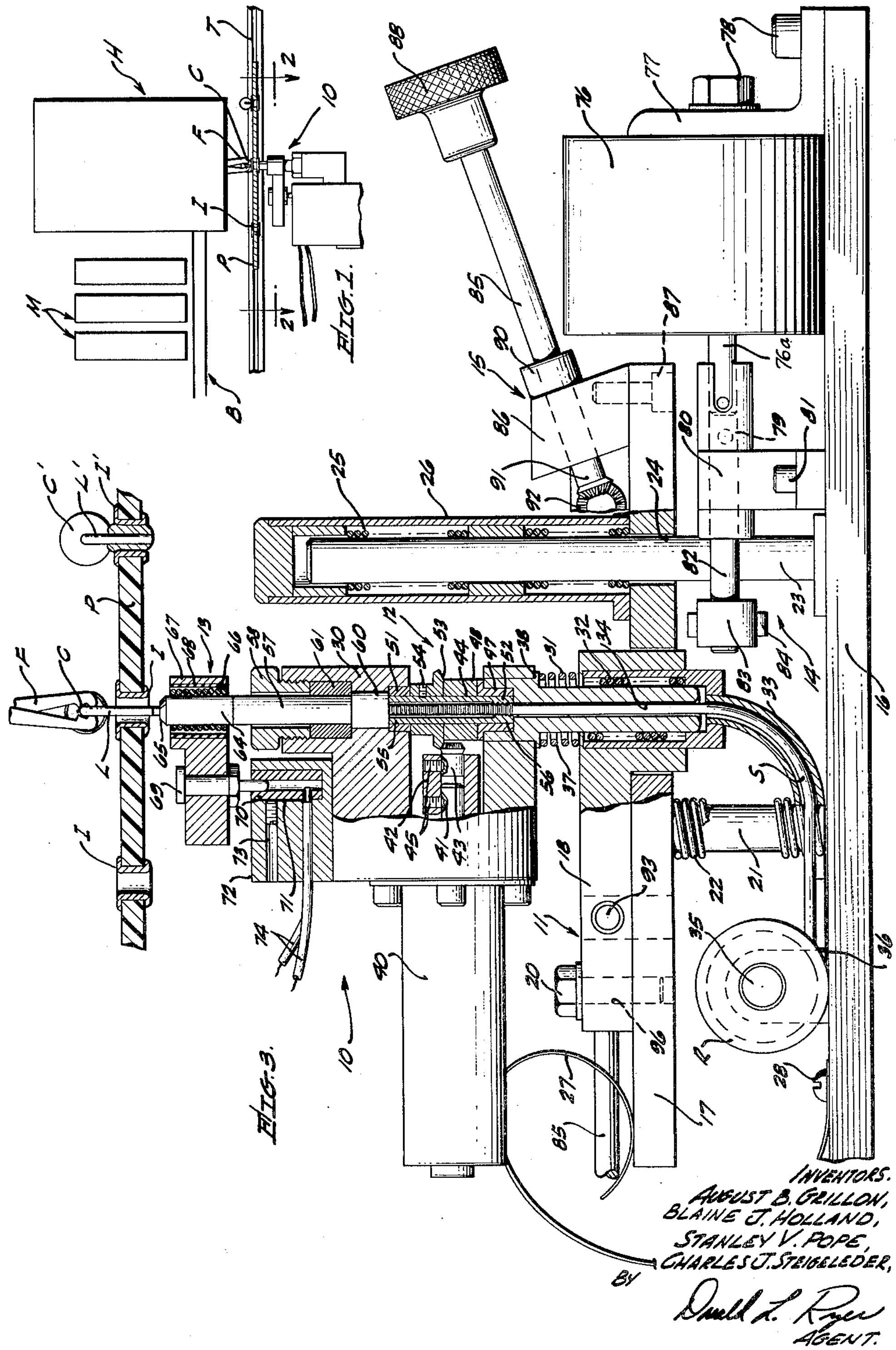
FIGURE 1 is a partially diagrammatic view showing a component insertion head, circuit board and the soldering apparatus of the present invention.
FIG. 3 is a longitudinal sectional view through the soldering apparatus shown in conjunction with a circuit board and electrical components, and taken substantially as indicated by line 3—3, FIG. 2.

With reference to the drawings and with reference primarily to FIG. 1, the soldering apparatus of this invention is shown as indicated generally at 10. The apparatus 10 is a portion of an entire assembly apparatus which includes a plurality of magazines M that are associated with a belt B that is adapted to receive components from the magazines and deliver such components to an automatic insertion head H. The head H has finger means F that are adapted to grip and support a component C. The automatic assembly apparatus further includes a track T which movably supports a printed circuit board P having eyelets I associated therewith. The components utilized herewith are of the axial leaded type having wire-like leads L that are adapted for disposition within the openings of the eyelets I.

Generally, the soldering apparatus of this invention includes a support or platform structure indicated generally at 11, solder advancing and feeding mechanisms 12, a pair of molten solder dispensing nozzles 13, a platform moving structure 14 and a means 15 for laterally positioning the dispensing nozzles 13.

The soldering apparatus 10 is carried by a fixed base member 16, adjacent which a movable platform forming a portion of the apparatus 11 is disposed. The platform 11 includes a plate member 17 to which an adjustable guide member 18 is secured by means of suitable bolts 20. A post 21 extends downwardly from the platform 17 and through a suitable opening in the base member 16, there being a compression spring 22 disposed about the post 21, whereby to urge the platform 17 in an upward direction. The platform 17 is further guided on a pair of rods 23 that are secured to the base member 16 and extend upwardly therefrom through openings 24 in the platform 17. Upper end portions of the rods 23 are longitudinally slidably journaled in axial bearings 25 carried by a bearing support structure 26 that is in turn secured to an upper surface of the platform 17. The platform 17 is urged in a downward direction by means of a coil leaf spring 27 that is secured to an upper surface of the base 16 by means of a screw 28 and which engage an upper surface of the platform 17. It may thus be seen that the platform 17 is accurately guided for vertical travel by means of the bearings 25 and bearing structures 26 and is biased upwardly by means of the compression spring 22, the force of which is balanced and damped by means of the leaf spring 27.

Figures 4, 5, 6:
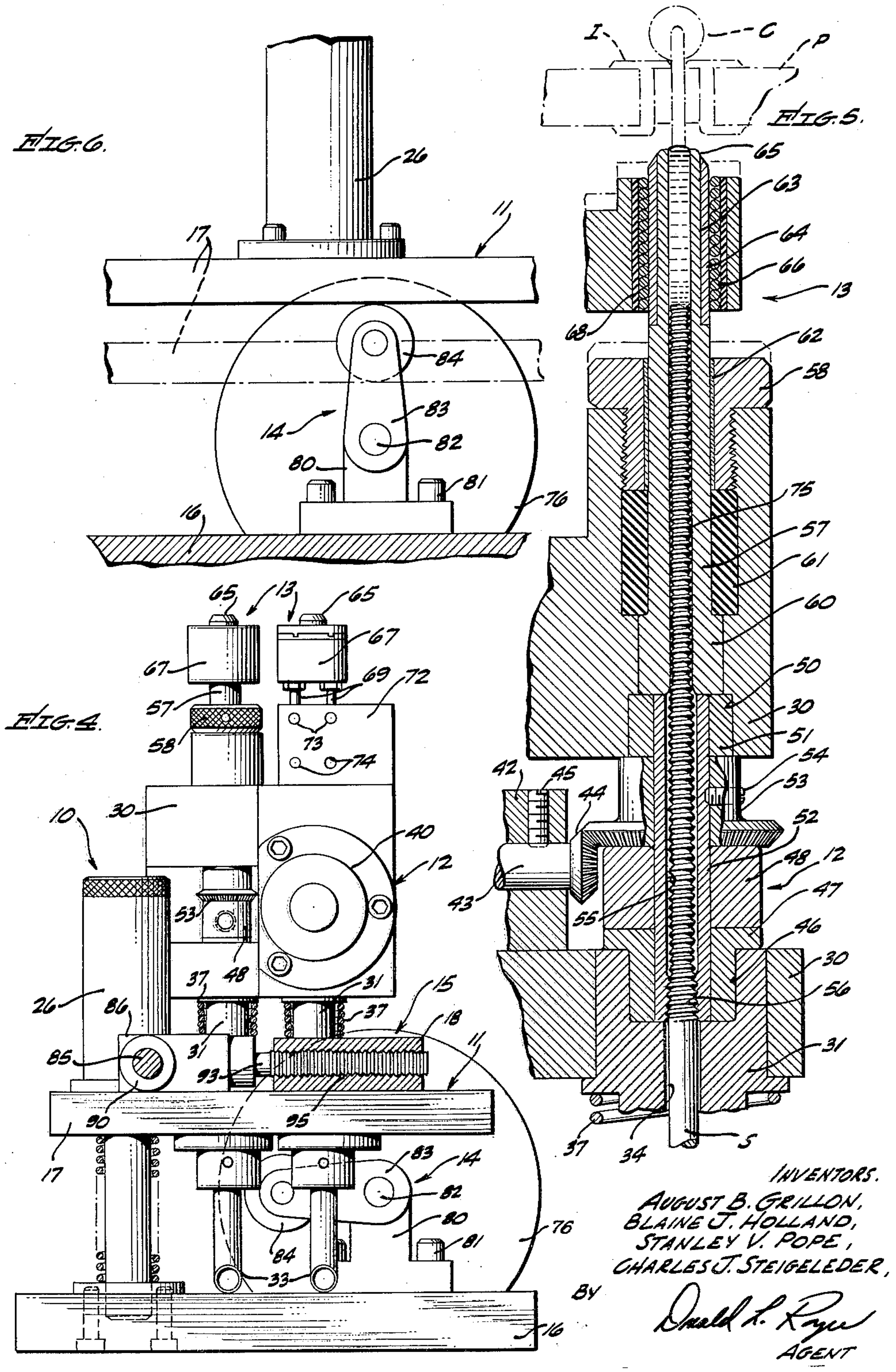
FIG. 4 is an end view, partially in section, of the present soldering apparatus.
FIG. 5 is an enlarged fragmentary sectional view of one of the solder dispensing nozzles of the present soldering apparatus.
FIG. 6 is an enlarged fragmentary sectional view showing a platform elevating means with portions of the apparatus in different positions.

As shown in FIGS. 3 and 5, the pair of solder advancing mechanisms 12 each includes a body member 30 that is supported on a stem 31 which extends into a recessed axial bearing 32 which is in turn carried by the guide member 18. A curved guide tube 33 is secured to a lower end portion of the guide member 18. Solder material S, from a reel R, is adapted for delivery through an axial bore 34 in the stem 31 by way of the tube 33. The reel R is supported on a shaft 35 which is in turn carried by a bracket 36 that is secured to the base member 16. A compression spring 37 is disposed between an upper face of the guide member 18 and a shoulder 38 disposed from the stem 31, whereby to support the solder advancing mechanism 12 and the nozzle 13. The mechanisms 12 and the nozzles 13 are thereby freely vertically movable within the bearing elements 32 for a purpose to be hereinafter more fully described.

The solder advancing mechanisms 12 each include a driving motor 40 that is secured to an outer face of the body 30 and which has an output shaft 41. The motor output shaft 41 is connected by means of a coupling 42 to a stub shaft 43 on which is formed a spur gear 44. The coupling 42 is secured to the shafts 41 and 43 by means of suitable screws 45.

As shown in FIGS. 3 and 5, the upper end of the stem 31 is provided with a recess 46 in which an insert bushing 47 is disposed. A thrust bushing 48 is positioned in contact with an upper surface of the bushing 47. The body 30 is also provided with the recess 50 in which a bushing 51 is disposed. As shown, a shaft 52 is rotatably journaled in the bushings 47 and 51, there being a spur gear 53 disposed between an upper surface of the thrust bushing 48 and a lower surface of the bushing 51 and secured to the shaft 52 by means of a set screw 54. The spur gear 53 is adapted for cooperation with the spur gear 44 whereby, upon operation of the electric motor 40, to rotate the gear 53 and the shaft 52.

The shaft 52 is provided with a longitudinal bore 55 therethrough, a lower end of which is threaded as at 56. As the solder material S is fed through the bore 34 of the stem 31, this solder material is externally threaded by means of the threads 56 which act as a thread cutting die, whereby to withdraw the solder material as from the reel R, through the tube 33 and bore 34 and advance the solder upwardly through the bore 55 of the shaft 52. As will be hereinafter more fully described, the electric motors 40 are intermittently operated whereby to move the solder material S when desired.

Each of the solder dispensing nozzle means 13 includes an elongated stem portion 57 that is carried by the body 30 and retained therein by means of a retaining nut 58 which threadably engages the body 30. A lower end portion of the nozzle 57 is enlarged as at 60, there being an insulating insert 61 disposed between a shoulder formed by the enlargement 60 and a lower end of the threaded retainer 58. A ceramic liner 62 is disposed about the shank of the nozzle member 57 and within the threaded retaining nut 58. The nozzle member 57 has a reduced diameter portion 63 adjacent an upper end thereof that is surrounded by a tight fitting sleeve 64. The sleeve 64 may be made from a highly conductive material such as copper or the like, while the material of the nozzle member 57 may be a relatively hard material such as titanium.

An upper terminal end 65 of the nozzle member 57 and the sleeve 64 are suitably beveled.

As shown also in FIGS. 3 and 5, a coiled electric heating element 66 is disposed about the sleeve 64 of the nozzle structure 13. The element 66 is supported by a retainer 67 and is insulated therefrom by means of a nonconductive sleeve 68. The retainer 67 is provided with a pair of vertically disposed connector pins 69 that are suitably electrically connected with the heating element 66. The connector pins 69 are adapted for slidable reception in connector sleeves 70 that are disposed in suitable recesses 71 in a block 72 that is mounted on an upper portion of the body 30. The sleeves 70 are retained in position by means of set screws 73 and are electrically connected to a suitable source of electric energy by means of a pair of leads 74.

As shown, each of the nozzle members 57 has a longitudinal bore 75 therethrough, with the solder material S being delivered through the bore by means of the rotating threaded portion 56 of the shaft 52. As the solder material S reaches the area surrounded by the heating element 66, the solder material is reduced to a molten state and dispensed from the end 65 of the nozzle 57.

As shown in FIGS. 3, 4 and 6, the platform moving mechanism 14 includes an electric motor 76 that is secured to the base member 16 by means of a bracket 77 and suitable bolts 78. An output shaft **76*a* of the motor 76 is connected to a coupling 79 that is journaled in a bearing block 80 that is in turn secured to the base member 16 by means of bolts 81. The coupling 79 is also connected to a shaft 82, an outer end of which supports a crank member 83 which in turn carries a roller 84. When the motor 76 is energized, the shaft 82 will be rotated and the roller 84 will engage a lower surface of the platform 17, whereby to raise the platform together with the mechanism carried thereby, including the nozzles 13, to a position whereby the upper ends 65 of the nozzles 13 will engage a lower flange of the eyelets I carried by the circuit board P. The motor 76 is suitably timed to provide dwell periods whereby to position the upper ends of the nozzles 13 in contact with the eyelets I for a predetermined period of time and, upon continued operation of the motor 76 to lower the platform structure 11 and mechanism carried thereby to a lowermost position. Relative positions of movement of the platform structure 11 and the nozzles 13 are shown by the solid and dotted lines of FIGS. 5 and 6. It may be seen that the compression springs 37 serve to maintain a tight engagement between the upper end 65 of the nozzle structures 13 and the eyelets I, with the nozzle structures having a distance of upward movement that is substantially less than the relative upward movement distance of the platform structure 11**.

Figure 2:
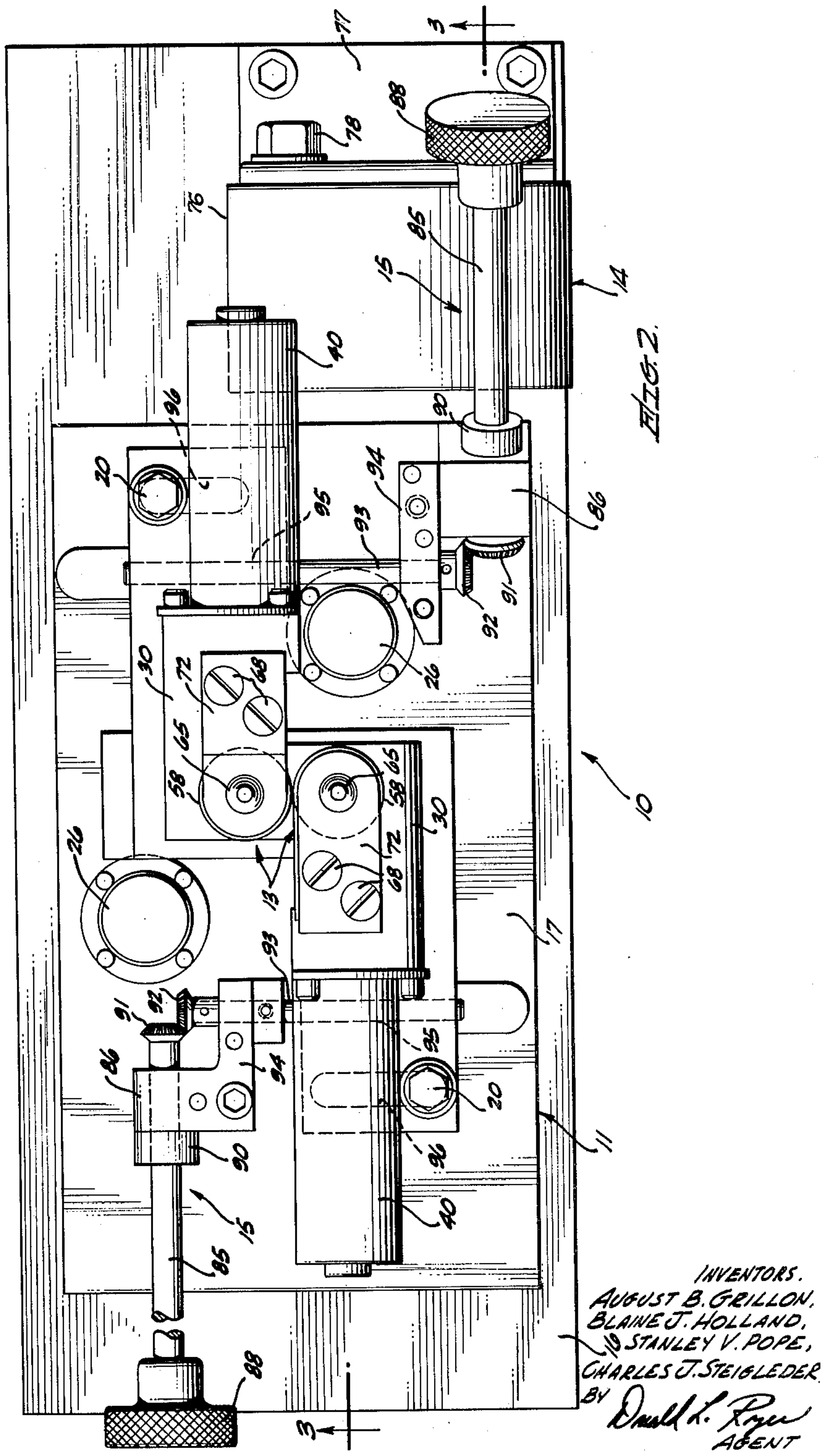
FIG. 2 is a top plan view of the soldering apparatus as taken substantially as indicated by line 2—2, FIG. 2.

As shown in FIGS. 2, 3 and 4, the nozzle position adjusting structures 15 are associated with each of the nozzles 13 and each include a shaft 85 that is carried by a bracket 86 that is in turn secured to an upper surface of the platform 17 by means of suitable screws 87. An outer end of the shaft 85 is provided with a knurled knob member 88, there being a bushing 90 disposed about the shaft 85 and adjacent one surface of the bracket 86. A lower end of the shaft 85 serves to support a spur gear 91 which in turn engages a spur gear 92 carried by a transverse shaft 93. The shaft 93 is journaled in a bracket structure 94 carried by the bracket 86 and threadably engages the fitting 18 as at 95. As described hereinbefore, the fitting 18 is adapted to carry the lower end portion of the stem 31 and is retained in position by means of bolts 20 which threadably engage the platform 17. When the bolts 20 are released, a suitable slot 96 in the fittings 18 permits lateral movement of the fittings 18 and the elements carried thereby, including the nozzle structures 13, upon rotation of one or the other or both of the shafts 85. Thus, the lateral positions of the nozzle structures 13 may be established, whereby to permit use of the present soldering apparatus in conjunction with printed circuit boards having different lateral spacings of eyelet patterns.

It may thus be seen that as the circuit board P is positioned and the leads L of the component C disposed through the eyelets I, as shown in FIG. 3, the nozzle structures 13 of the present apparatus will be moved into contact with the lower surface flanges of the eyelets I through operation of the motor 76. Thereafter, the motors 40 are energized whereby to advance and dispense molten solder from the upper ends of the nozzle members 57 and into the areas between the component leads L and inner surfaces of the eyelets I. As the nozzle structures 13 are moved downwardly away from the circuit boards, the motors 40 are timed for slight actuation, whereby to move a small quantity of molten solder upwardly within the bores 75 of the nozzle members 57, thus to present a slightly protruding bulb of molten solder as shown in FIG. 5 and whereby to present the solder material in a desired manner for the next soldering operation. As shown in FIG. 3, the component C′ and the eyelet I′ have been previously soldered in position with the solder material completely filling the area between the lead L′ and the eyelet I′.

It may thus be seen that the components C are automatically positioned and soldered in such position by means of the automatic soldering apparatus of this invention. The particular construction of the threaded portion 56 of the shaft 52 enables delivery of the solder material in a positive manner and with no tendency for binding or sticking in the bores 55 or 75. The particular construction, including the guide members 26 and bearings 25, together with the posts 21 and springs 22 and 27, serves to enable precise guiding and alignment of the elements of the soldering apparatus with the eyelets I and component leads L. Additionally, the heating element 66 is electrically controlled in such a manner as to permit delivery of molten solder at precisely the correct temperature. Accordingly, only sufficient heat to provide the molten solder and insure a satisfactory solder joint between the component leads L and the eyelets I is permitted and for only a minimum time, thus to prevent damage to the components C by application of excessive heat thereto.

Having thus described the invention and the present embodiment thereof, it is desired to emphasize the fact that many modifications may be resorted to in a manner limited only by a just interpretation of the following claims.

We claim:

1. In an apparatus for dispensing fused electrical conducting material about a component lead disposed through an opening in a circuit board, said circuit board and said component lead being supported relative to said apparatus, the combination of: a fixed base structure; a horizontally disposed platform movably carried by said base structure; at least one vertically disposed, generally tubular fused material dispensing nozzle rotatably carried by said platform in a position axially aligned with said component lead; an electric heating element disposed about a dispensing end portion of said nozzle, said end portion being normally spaced from an end of said component lead; means for moving said platform and said nozzle carried thereby to a position for reception of said end of said component lead in said dispensing end portion of said nozzle and engagement of said end portion of said nozzle with a surface of elements carried by said circuit board, said moving means serving thereafter to move said platform and said nozzle away from said circuit board; a rotatable, internally threaded threading means for externally threadably engaging a solid portion of a strand of fusible electrical conducting material; means rotatably mounting said internally threaded means at the end of said nozzle opposite said dispensing end position; and an electric motor carried by said platform and connected to said internally threaded means to rotate said internally threaded means whereby to advance said fusible electrical conducting material through and in a molten state from said nozzle at least while said dispensing end portion of said nozzle end is in contact with said elements carried by said circuit board.

2. A soldering apparatus for dispensing molten solder about a component lead disposed through an eyeletted opening in a printed circuit board, said circuit board and said component lead being supported relative to said apparatus, said soldering apparatus comprising, in combination: a fixed base structure; a platform movably disposed in parallel relationship over and to said base structure; means for guiding said platform relative to said base structure; a nozzle supporting body carried by said platform; a pair of tubular solder dispensing nozzles carried by said body and disposed on laterally spaced vertical axes, each nozzle having a rotatable portion; electric motor driving means carried by said body and connected with said rotatable portions of said nozzles whereby to cause rotation of said portions of said nozzles; an internally threaded threading section in each of said rotatable nozzle portions, adapted to externally threadably engage a strand of solder material for moving said solder material through said nozzle by rotation of said nozzle portion and internally threaded section relative to said solder material; an electric heating element disposed about an upper end portion of each of said nozzles whereby to melt said solder material in each end portion; and means for elevating said platform and structure carried thereby, whereby to dispose solder dispensing ends of said nozzles in contact with said eyelets and to permit dispensing of molten solder into areas between said eyelets and said component leads, continued movement of said elevating means serving to lower said platform, said electric motor driving means being intermittently operated to advance said solder material when said nozzle ends are in contact with said eyelets.

References Cited in the file of this patent

UNITED STATES PATENTS

| | | |
|---|---|---|
| 1,039,707 | Denne | Oct. 1, 1912 |
| 1,783,642 | Ferguson et al. | Dec. 2, 1930 |
| 2,285,872 | Pearson | June 9, 1942 |
| 2,683,433 | Schanz | July 13, 1954 |
| 2,725,026 | Brandt | Nov. 29, 1955 |
| 2,770,875 | Zimmerman | Nov. 20, 1956 |
| 2,810,168 | Nyborg | Oct. 22, 1957 |
| 2,830,846 | Tench | Apr. 15, 1958 |
| 2,875,719 | Smith | Mar. 3, 1959 |